United States Patent [19]
Lim et al.

[11] Patent Number: 5,624,874
[45] Date of Patent: Apr. 29, 1997

[54] BARRIER LAYER ENHANCEMENT IN METALLIZATION SCHEME FOR SEMICONDUCTOR DEVICE FABRICATION

[75] Inventors: Sheldon C. P. Lim, Sunnyvale; Stanley C. Chu, Cupertino, both of Calif.

[73] Assignee: North America Philips Corporation, New York, N.Y.

[21] Appl. No.: 544,739

[22] Filed: Oct. 18, 1995

Related U.S. Application Data

[63] Continuation of Ser. No. 400,777, Mar. 6, 1995, abandoned, which is a continuation of Ser. No. 117,963, Sep. 7, 1993, abandoned, which is a continuation of Ser. No. 865,733, Apr. 9, 1992, abandoned, which is a continuation of Ser. No. 693,167, Apr. 29, 1991, abandoned.

[51] Int. Cl.$^6$ .................... H01L 21/28; H01L 21/288
[52] U.S. Cl. .................... 438/653; 427/126.3; 427/435; 438/768
[58] Field of Search .................... 437/189, 190, 437/192, 194, 195, 235, 236, 237, 245, 246; 427/126.1, 126.3, 430.1, 435, 436; 148/DIG. 20, DIG. 118

[56] References Cited

U.S. PATENT DOCUMENTS

| | | | |
|---|---|---|---|
| 4,104,424 | 8/1978 | Steinbrecher et al. | 427/435 |
| 4,176,206 | 11/1979 | Inoue | 437/237 |
| 4,199,624 | 4/1980 | Smith | 427/435 |
| 4,373,050 | 2/1983 | Steinbrecher et al. | 427/435 |
| 4,696,098 | 9/1987 | Yen | 437/228 |
| 4,744,858 | 5/1988 | McDavid et al. | 437/192 |
| 4,787,958 | 11/1988 | Lytle | 437/246 |
| 4,814,293 | 3/1989 | Van Oekel | 437/246 |
| 4,990,997 | 2/1991 | Nishida | 357/71 |
| 5,019,234 | 5/1991 | Harper | 437/190 |
| 5,073,408 | 12/1991 | Goda et al. | 427/435 |
| 5,093,710 | 3/1992 | Higuchi | 437/195 |

FOREIGN PATENT DOCUMENTS

| | | | |
|---|---|---|---|
| 56-69723 | 6/1981 | Japan | 427/435 |
| 57-28952 | 2/1982 | Japan | 427/435 |
| 57-143479 | 9/1982 | Japan | 427/435 |
| 58-55573 | 4/1983 | Japan | 427/435 |
| 62-56581 | 3/1987 | Japan | 425/435 |
| 62-166505 | 7/1987 | Japan | 427/435 |
| 1-127681 | 5/1989 | Japan | 427/435 |

OTHER PUBLICATIONS

H.G. Tompkins et. al., "An investigation of the oxidation of Ti:W", J. Appl. Phys. 64(6), 15 Sep. 1988, pp. 3269–3272.

J.-S. Maa et al., "Reflectivity reduction by oxygen plasma treatment of capped metallization layer", J. Vac. Sci. Technol. B7(2), Mar./Apr. 1989, pp.145–149.

*Primary Examiner*—Mary Wilczewski
*Attorney, Agent, or Firm*—Michael J. Balconi-Lamica; Ronald Drumheller; Daniel E. Tierney

[57] ABSTRACT

The properties of a diffusion barrier material layer over a semiconductor substrate are enhanced in a simple and time-effective manner by immersing the substrate in an oxidizing liquid. For a titanium-tungsten barrier metal, a dip in nitric acid for 1–60 minutes provides the metal with an oxide layer of the right thickness of 10–20 Å.

10 Claims, 2 Drawing Sheets

BARRIER LAYER ENHANCEMENT IN METALLIZATION SCHEME FOR SEMICONDUCTOR DEVICE FABRICATION

This is a continuation of application Ser. No. 08/400,777, filed on Mar. 6, 1995, abandoned, which is a continuation of application Ser. No. 08/117,963, filed Sep. 7, 1993, abandoned which is a continuation of application Ser. No. 07/865,733, filed Apr. 9, 1992, abandoned, which is a continuation of application Ser. No. 07/693,167, filed Apr. 29, 1991, abandoned.

FIELD OF THE INVENTION

The invention relates to a method of fabricating a semiconductor device in a portion of a semiconductor substrate, the method comprising the step of forming an oxide on top of a barrier material layer prior to depositing a further material layer over the barrier material layer.

BACKGROUND ART

In the field of fabricating VLSI circuits the metallization materials that are used for establishing contacts and interconnects are known to cause failures due to electromigration or other interaction at the interface between the metallization material and the substrate, or between successive metallization materials. To reduce the likelihood of the occurrence of these failures a diffusion barrier is introduced between the metallization material and the substrate, or between two successive metallization materials.

Titanium-tungsten, for instance, has been widely used as a diffusion barrier between aluminum-based films and a silicon substrate. It has become known that relatively poor vacuum levels during sputtering of titanium-tungsten improve the quality of the barrier integrity. It has also been recognized that an interfacial oxide layer between the aluminum-based film and the titanium-tungsten film is needed for good barrier properties. The oxide formed by oxidizing titanium-tungsten is found to be a mixture of titanium oxide and tungsten oxide. See, for instance, H. G. Tompkins et al., "An investigation of the oxidation of Ti:W", J. Appl. Phys. 64(6), 15 September 1988, pp. 3269–3272. In older systems, the titanium-tungsten film is deposited on the wafer by sputtering, carried out in a first bell jar system, after which the bell jar is opened and the wafer is transferred to another system for the deposition of aluminum. This procedure exposes the wafer to air, thereby oxidizing the wafer's surface and furnishing a native oxide over the titanium-tungsten film. The opening of the bell jar also exposes the titanium-tungsten target to air, thereby oxidizing its surface. This results in a less pure film of titanium-tungsten in the next deposition cycle.

In modern systems, such as load-lock systems, wafers are kept under a higher vacuum during titanium-tungsten deposition than is attainable in older systems. As a result, the titanium-tungsten films thus deposited are purer than those formed in the more conventional systems. Purer titanium-tungsten films turn out to have relatively poor barrier performance. In addition, the load-lock systems are generally used to perform a series of different deposition steps without removing the wafer and, as a consequence, without breaking the vacuum. This excludes the growth of an oxide on the targets.

Alternatively, owing to general improvements in manufacturing cycle times, the time span between the titanium-tungsten deposition and the aluminum deposition is reduced considerably. The shorter sit times after titanium-tungsten deposition lead to poor barrier performance since the oxide layer on top of the titanium-tungsten by the exposure to air is inadequate, if formed at all.

These barrier failures become apparent particularly by low forward voltages of Schottky diodes that are fabricated at the contact level to the silicon semiconductor substrate.

The barrier properties become worse when the titanium-tungsten is subjected to further heat treatments at high temperatures as in modern processes. For example, the titanium-tungsten that is employed at the lowest metal level currently used must withstand the following heat treatments: spin-on-glass cures up to 480° C. for the contact dielectric and again for the via dielectric; chemical vapor deposition or plasma enhanced deposition of oxides and nitrides at temperatures up to 450° C. for the contact, via and passivation dielectrics; and heat treatments, typically at 450° C., to anneal oxide defects.

In short, use of modern fabrication equipment and the attendant cycle time reduction lead to poorer barrier layers.

One obvious solution to alleviate the problem of poor barrier performance would be to deliberately expose the titanium-tungsten to air at ambient temperature. However, exposing the titanium-tungsten film to air for even 4 hours prior to aluminum deposition does not bring about the required barrier quality. Furthermore, an additional process step of this length is unacceptable in cost-effective fabrication.

Other solutions would be to include exposing the barrier metal to an oxidizing ambient at higher temperatures, for instance at about 200° C. or higher, or using plasma assisted oxidation. However, there is a delicate balance between sufficient oxidation and too much. The required thickness of the oxide layer is thought to lie in the range of 10–20 Å. A layer thinner than 10 Å would not attain the desired barrier properties, whereas a layer thicker than 20 Å would lead to etching difficulties later on and to increased contact resistance. Oxidation at higher temperatures has the disadvantage that the oxide layer grows too rapidly, thereby rendering its thickness difficult to control. See FIG. 4 of H. G. Tompkins et al., (ibid.). Oxidation in a plasma oxygen ambient has been reported to give an oxide thickness of about 40 Å in 5 minutes. See J. -S. Maa et al., "Reflectivity reduction by oxygen plasma treatment of capped metallization layer", J. Vac. Sci. Technol. B7(2), March/April 1989, pp. 145–149. It can be inferred that the time necessary to obtain a film of 10–20 Å should lie approximately between 1–2 minutes, possibly depending on the sit time before the plasma oxidation. Therefore, control of the oxide thickness would be difficult, unless the oxidation is performed in-situ in the titanium-tungsten deposition system without breaking the vacuum. However, a system designed for both titanium-tungsten deposition and plasma oxidation is not commercially available at this time.

OBJECTS OF THE INVENTION

It is an object of the invention to provide a method as mentioned in the preamble wherein the barrier properties of the barrier metal layer are established in a simple and time-effective way. More specifically, it is an object of the invention to provide an adequate oxide layer on top of the barrier metal layer in a manner that is compatible with state-of-the-art fabrication equipment and cycle time requirements.

SUMMARY OF THE INVENTION

To this end, the invention provides a method of fabricating a semiconductor device in a portion of a semiconductor substrate, the method comprising the step of forming an oxide on top of a barrier material layer prior to depositing a further material layer over the barrier material layer. The oxide layer is formed on top of the barrier material layer by interaction with a liquid oxidizing agent while the substrate's portion is substantially inaccessible to the agent.

The interaction is preferably achieved by immersing the substrate in the liquid oxidizing agent at room temperature. The immersion in -the liquid oxidizing agent is a very simple and cost effective operation. Typically, the substrate's portion is made inaccessible to the agent by covering the substrate with a blanket of the barrier material. The oxidizing agent typically includes an acid.

For titanium-tungsten as a barrier material, preferably the oxidizing agent includes nitric acid. The duration of the dip in concentrated nitric acid (70%) at room temperature is in the range of 1–60 minutes.

BRIEF DESCRIPTION OF THE DRAWING

The invention will be explained by way of example and with reference to the accompanying drawing, in which.

DETAILED DESCRIPTION OF THE EMBODIMENTS

Figure 1:
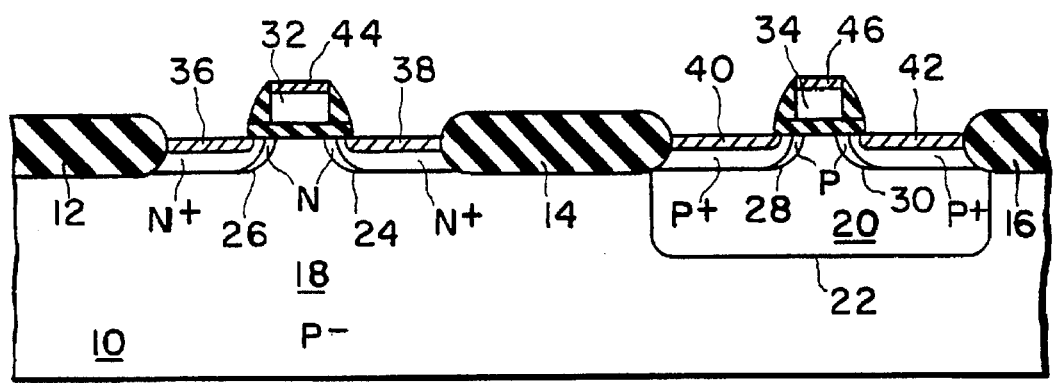
FIG. 1 shows a schematic cross-section of a silicon semiconductor substrate up to the formation of main electrodes and control electrodes for transistors.
Figure 2:
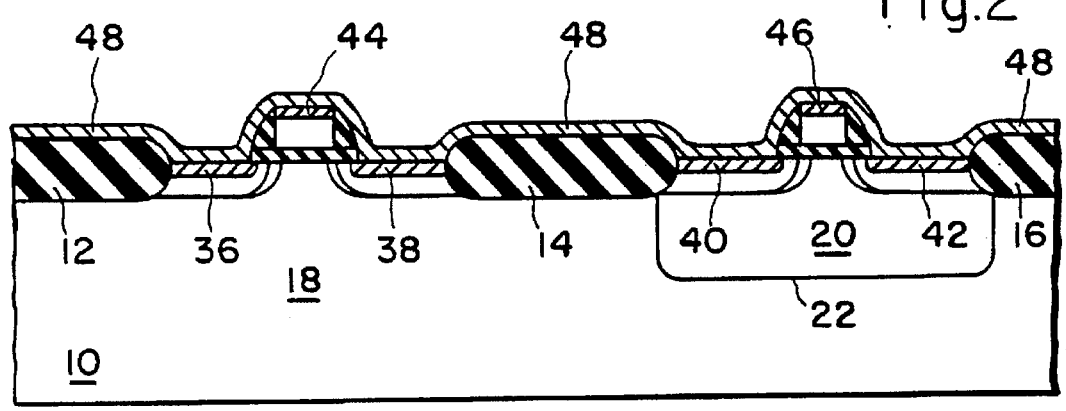
FIG. 2 shows the substrate after deposition of a titanium-tungsten barrier layer.

FIG. 1 shows a schematic cross-section of a part of a P-type silicon semiconductor substrate 10, containing field oxide regions 12, 14 and 16. An N-channel field effect transistor (NFET) 18 is located between the field oxide regions 12 and 14, and a P-channel field effect transistor (PFET) 20 is located in an N-type well 22 between field oxide regions 14 and 16. NFET 18 comprises drain 24 and source 26 that each include a lightly doped part, labeled "N" and a heavily doped part labeled "N$^+$". PFET 20 comprises drain 28 and source 30 that each include a lightly doped part, labeled "P", and a heavily doped part, labeled "P$^+$". Further, NFET 18 has a doped polycrystalline gate electrode 32, and PFET 20 has a doped polycrystalline gate electrode 34. The contacts to be created to main electrodes 24, 26, 28, 30 and gate electrodes 32 and 34 include silicided portions 36, 38, 40 and 42, and 44 and 46, respectively. Portions 36–46 may comprise, for instance, platinum-silicide as is known in the art. Referring to FIG. 2, substrate 10 is then covered with a blanket of a barrier metal 48, for instance, titanium-tungsten (10–15 wt. % titanium). Typically, layer 48 has a thickness of 1000 Å.

Figure 3:
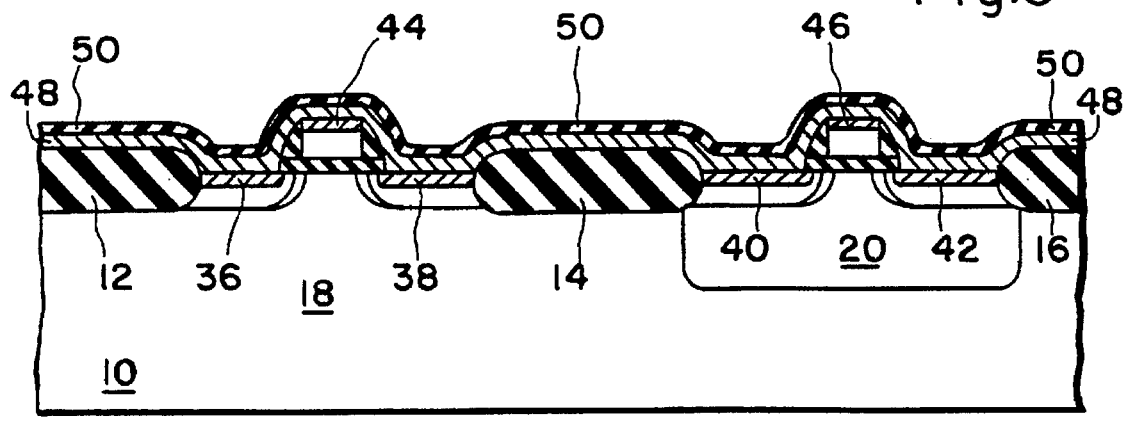
FIG. 3 shows the substrate after oxidation of the titanium-tungsten by a dip in the nitric acid.

Referring to FIG. 3, substrate 10 is thereupon immersed in nitric acid at room temperature. The nitric acid is concentrated, e.g., about 70%, as is usually supplied by chemical vendors. This causes an oxide layer 50 to grow on top of blanket 48. Oxide layer 50 contains a mixture of titanium-oxide and tungsten-oxide, as mentioned in the background art section. It has been found experimentally that a 5-minutes dip in concentrated nitric acid at room temperature is effective for the substrates processed in conventional bell jar systems, whereas a 15-minutes dip is adequate for substrates processed in state-of-the-art load-lock systems. Oxide layer 50 thus grown typically is 10–20 Å thick. Note that titanium-tungsten blanket 48 prevents underlying silicon substrate 10 from interacting with the nitric acid.

Figure 4:
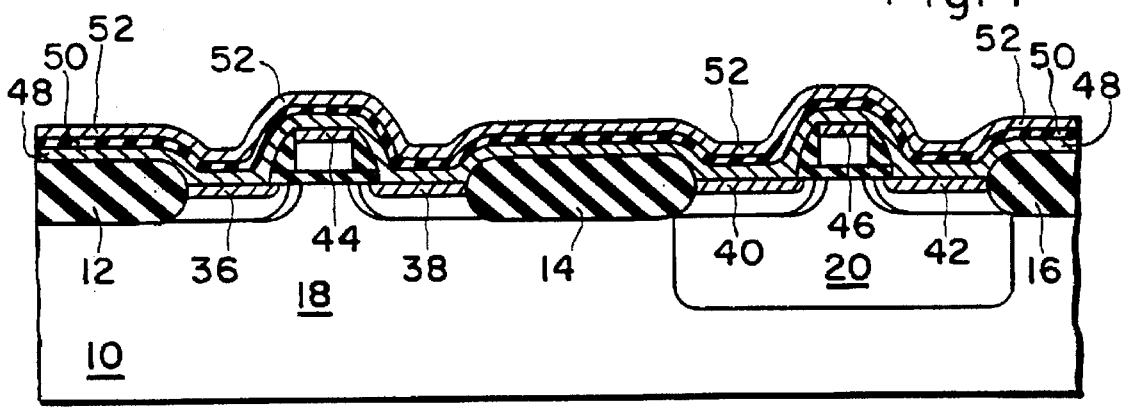
FIG. 4 shows the substrate after formation of an aluminum-based layer over the oxidized barrier metal layer.

Referring to FIG. 4, a blanket 52 of an aluminum-based material is thereupon formed on top of oxide layer 50 in a known manner. Layer 52 typically contains aluminum-copper (1 wt. % copper). Typically, the thickness of layer 52 is 3000 Å.

Figure 5:
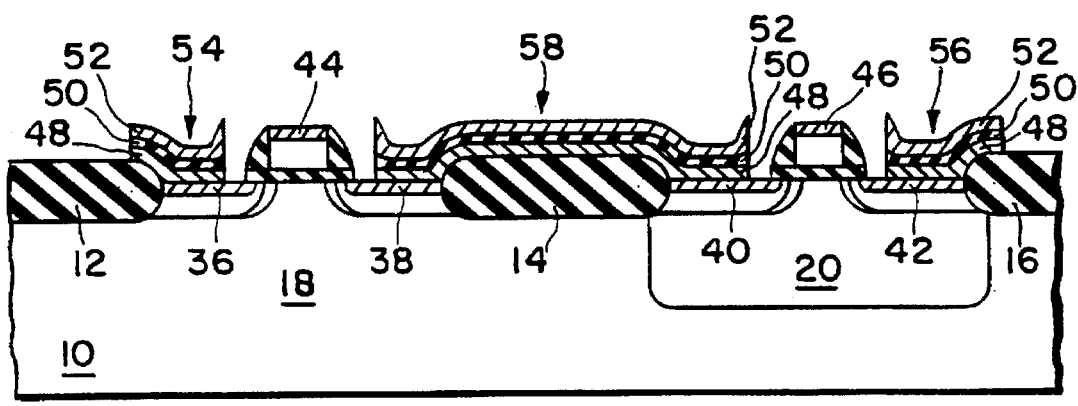
FIG. 5 shows the substrate after patterning the layers.

Referring to FIG. 5, layers 48, 50 and 52 thereafter are patterned, such as by masking and etching, to form contact straps 54 and 56, and interconnect 58 at this lowest metal level. The consecutive blanket formation steps of layers 48, 50 and 52 followed by a patterning step has the advantage that the patterning can be performed with only a single mask.

The nitric acid dip is time-effective as well as simple. Including rinse time and dry time, typically 20 minutes each, the total added process time is less than one hour. This contrasts greatly with the 4-hour sit time indicated above. Other candidates for the oxidizing agents are concentrated sulfuric acid (95%) and the acids of the halogens, such as iodic acid. When a weaker oxidizing agent is used, the immersion may be performed at a temperature higher than room temperature in order to speed up the oxide growth. The appropriate temperature then typically lies between room temperature and 100° C.

The immersion in the acid is not restricted to enhancing the barrier properties between silicon and aluminum-based metal layers. Appropriate barrier properties of titanium-tungsten between an aluminum-based metal layer and gold, occurring in, for instance, bump plating or in tape automatic bonding, are obtained in the same way according to the invention.

More generally, establishing reliable barriers is accomplished in accordance with the invention by the chemical oxide growth on top of a barrier metal layer through immersion in an oxidizing liquid. This not only applies to the lowest level in the metallization scheme for a semiconductor device, that is, at the interface between the semiconductor material and a metal, but also applies to higher level vias and interconnects between various metals.

The method according to the invention may, for instance, be employed in processes for the fabrication of bipolar devices, in processes for the fabrication of field effect transistor devices or in processes where bipolar transistors and field effect transistors are formed in the same semiconductor substrate. Also, the method applies to both the fabrication of an integrated circuit and the fabrication of a discrete semiconductor device.

We claim:

1. A method of fabricating a semiconductor device in a portion of a semiconductor substrate, the method comprising the step of forming an oxide layer on top of a barrier material layer of titanium-tungsten prior to depositing a further material layer over the oxide layer, wherein the oxide layer is formed by oxidizing a surface of the barrier material layer with a liquid oxidizing agent at a temperature between room temperature and 100° C. for a time sufficient to produce an oxide layer of titanium and tungsten oxides having a thickness on the order of 10–20 angstroms.

2. A method as in claim 1 wherein the oxidizing is performed by immersing the portion in the oxidizing agent.

3. A method as in claim 2 wherein the immersion is performed at room temperature.

4. A method as in claim 1 wherein the portion is made inaccessible to the oxidizing agent by means of a blanket deposition of the barrier material layer over the portion.

5. A method as in claim 1 wherein the oxidizing agent includes an acid.

6. A method as in claim 5 wherein the acid includes nitric acid or sulfuric acid.

7. A method as in claim 6 wherein the barrier material layer is immersed in the nitric acid for 1 to 60 minutes at room temperature.

8. A method as in claim 6 wherein the barrier material layer is immersed in the nitric acid for 5 to 15 minutes at room temperature.

9. In a method of fabricating a semiconductor device in a portion of a semiconductor substrate, wherein the method includes the step of forming a barrier layer prior to depositing a further material layer over the barrier layer, the barrier layer comprising a material layer of titanium-tungsten and an oxide layer on the material layer of titanium-tungsten, the improvement comprising forming the oxide layer by oxidizing a surface of the titanium-tungsten material layer by immersion thereof into an oxidizing liquid for a time sufficient thereby to produce on the material layer of titanium-tungsten an oxide layer of titanium and tungsten oxides having a thickness on the order of 10–20 angstroms.

10. A method as defined in claim 9 wherein the oxide layer is formed at a temperature between room temperature and 100° C.

* * * * *